United States Patent
Watanabe et al.

(10) Patent No.: US 9,219,348 B2
(45) Date of Patent: Dec. 22, 2015

(54) EDGE-EMITTING SEMICONDUCTOR LASER ELEMENT

(75) Inventors: Akiyoshi Watanabe, Hamamatsu (JP);
Kazuyoshi Hirose, Hamamatsu (JP);
Kousuke Shibata, Hamamatsu (JP);
Takahiro Sugiyama, Hamamatsu (JP);
Yoshitaka Kurosaka, Hamamatsu (JP);
Susumu Noda, Kyoto (JP)

(73) Assignees: Kyoto University, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/003,549

(22) PCT Filed: Feb. 29, 2012

(86) PCT No.: PCT/JP2012/055118
§ 371 (c)(1),
(2), (4) Date: Oct. 10, 2013

(87) PCT Pub. No.: WO2012/121083
PCT Pub. Date: Sep. 13, 2012

(65) Prior Publication Data
US 2014/0036947 A1 Feb. 6, 2014

(30) Foreign Application Priority Data
Mar. 8, 2011 (JP) ................ P2011-050688

(51) Int. Cl.
*H01S 5/00* (2006.01)
*H01S 5/12* (2006.01)
(Continued)

(52) U.S. Cl.
CPC . *H01S 5/12* (2013.01); *H01S 5/105* (2013.01); *H01S 5/22* (2013.01); *H01S 2301/18* (2013.01)

(58) Field of Classification Search
CPC ... H01S 3/0602; H01S 3/0608; H01S 3/0092; H01S 3/06704; H01S 3/06712; H01S 3/06791; H01S 3/08059; H01S 3/083; H01S 3/091; H01S 3/113; H01S 3/115; H01S 5/028; H01S 5/10; H01S 5/105; H01S 5/1092; H01S 5/3013; H01S 2301/02
USPC ................................... 372/44.01
See application file for complete search history.

(56) References Cited

U.S. PATENT DOCUMENTS

| 6,674,778 B1 * | 1/2004 | Lin et al. ............ 372/46.01 |
| 7,248,612 B2 * | 7/2007 | Asatsuma et al. ...... 372/43.01 |

(Continued)

FOREIGN PATENT DOCUMENTS

| JP | H11-330619 A | 11/1999 |
| JP | 2004-087980 A | 3/2004 |

(Continued)

*Primary Examiner* — Jessica Stultz
*Assistant Examiner* — Vu A Vu
(74) *Attorney, Agent, or Firm* — Drinker Biddle & Reath LLP

(57) ABSTRACT

The present edge-emitting semiconductor layer element includes two-dimensional photonic crystals 4 formed in a semiconductor layer, and when one direction of a contact region of an electrode 8 is provided as a length direction (X-direction) and a direction perpendicular to both of the length direction and a thickness direction of a substrate is provided as a width direction (Y-direction), the two-dimensional photonic crystals 4 are, when viewed from a direction (Z-axis) perpendicular to the substrate, located in a region containing the electrode contact region and wider in the width direction than the contact region, and have a refractive index periodic structure in which the refractive index satisfies a Bragg's diffraction condition while periodically changing at every interval along the one direction (X-axis).

4 Claims, 10 Drawing Sheets

(51) Int. Cl.
*H01S 5/10* (2006.01)
*H01S 5/22* (2006.01)

(56) References Cited

U.S. PATENT DOCUMENTS

2010/0246625 A1* 9/2010 Kawashima et al. ...... 372/45.01
2011/0228805 A1* 9/2011 Trankle et al. ............. 372/50.11

FOREIGN PATENT DOCUMENTS

| JP | 2004-172506 A | 6/2004 |
| JP | 2006-186090 A | 7/2006 |
| JP | 2007-294789 A | 11/2007 |
| JP | 2008-040230 A | 2/2008 |

* cited by examiner

EDGE-EMITTING SEMICONDUCTOR LASER ELEMENT

TECHNICAL FIELD

The present invention relates to an edge-emitting semiconductor laser element.

BACKGROUND ART

A general semiconductor laser element has a type of structure in which light is emitted from a cleaved edge of a semiconductor substrate, and is called an edge-emitting laser. Recently, applied research (Patent Document 1 to Patent Document 4) using photonic crystals has been performed concerning semiconductor laser elements.

CITATION LIST

Patent Literature

Patent Document 1: Japanese Patent Application Laid-Open No. H11-330619
Patent Document 2: Japanese Patent Application Laid-Open No. 2006-186090
Patent Document 3: Japanese Patent Application Laid-Open No. 2004-172506
Patent Document 4: Japanese Patent Application Laid-Open No. 2004-87980

SUMMARY OF INVENTION

Technical Problem

However, in most cases, a conventional semiconductor laser element does not have a function for controlling the spatial transverse mode in the width direction of the waveguide, and particularly, in the case of a high-output semiconductor laser with a wide waveguide width, the spatial traverse mode cannot be stabilized, such that multiple spatial traverse modes occur to cause multimode oscillation. When transverse multimode oscillation occurs in an unstable manner, near-field patterns (NFPs) and far-field patterns (FFPs) at a light emitting edge have non-uniform shapes, and the shapes further change according to driving conditions. Such an unstable spatial transverse mode operation makes precise light condensing and shaping by a lens system difficult, and thus has been a factor in hindering application of semiconductor laser elements.

An aspect of the present invention has been made in view of such a problem, and an object thereof is to provide an edge-emitting semiconductor laser element capable of uniformizing the light emission shape and restricting change in mode according to driving conditions by stabilizing a spatial transverse mode operation by using photonic crystals that can define an electromagnetic field distribution of light to be generated in an element.

Solution to Problem

In order to solve the foregoing problem, an edge-emitting semiconductor laser element according to an aspect of the present invention comprises: a semiconductor layer formed by at least an active layer, a light guide layer, and a cladding layer being stacked in sequence on a substrate; and a drive current electrode being in contact with the semiconductor layer, and a contact region of which with the semiconductor layer extends along one direction perpendicular to a thickness direction of the substrate, wherein the edge-emitting semiconductor laser element emits laser light from an edge located at one end in the one direction in the active layer, wherein said edge-emitting semiconductor laser element further comprises a two-dimensional photonic crystal formed in the semiconductor layer, wherein the one direction of the contact region defined as a length direction and a direction perpendicular to both of the length direction and the substrate thickness direction is defined as a width direction, wherein when viewed from a direction perpendicular to the substrate, the two-dimensional photonic crystal is located in a region containing the contact region and wider in the width direction than the contact region, wherein the two-dimensional photonic crystal comprises a refractive index periodic structure in which the refractive index periodically changes at every interval d1 along the one direction, wherein the two-dimensional photonic crystal satisfies a Bragg's diffraction condition: $d1 = q1 \times \lambda/(2 \times n)$ with respect to the laser light with a wavelength of $\lambda$, where q1 is a natural number and n is an effective refractive index of light in the active layer.

In this case of an edge-emitting semiconductor laser element, there are formed two-dimensional photonic crystal up to the region where carriers spread out outside the electrode contact region, and the Bragg diffraction condition is satisfied in the resonator length direction, so that an electromagnetic field distribution of light to be generated inside the element is defined, the spatial transverse mode of laser light to be obtained is stabilized, and the light emission shape can be uniformized.

The edge-emitting semiconductor laser element is characterized in that the two-dimensional photonic crystal has a refractive index periodic structure in which the refractive index periodically changes at every interval d2 along a direction that intersects the one direction, and satisfy a Bragg's diffraction condition: $d2 = q2 \times \lambda/(2 \times n)$ with respect to the laser light with a wavelength of $\lambda$, where q2 is a natural number.

In this case of an edge-emitting semiconductor laser element, there are formed two-dimensional photonic crystal up to the region where carriers spread out outside the electrode contact region, and the Bragg diffraction condition is satisfied also in the direction that intersects the resonator length, so that an electromagnetic field distribution of light to be generated inside the element is two-dimensionally defined within an element surface, the spatial transverse mode of laser light to be obtained is stabilized, and the light emission shape can be uniformized.

That is, it is preferable that the supplied carries are spread out by some sizes from both end positions of the contact region in the width direction; and wherein when viewed from a direction perpendicular to the substrate, the two-dimensional photonic crystal is located in a region equal to or wider in the width direction than a region, and this region includes the contact region and is wider than the contact region by the carrier-spread-out sizes in the width direction.

Because the two-dimensional photonic crystal is formed so as to contain the part where carriers have spread out, an electromagnetic field distribution is two-dimensionally defined within an element surface sufficiently inside the element, and the mode of laser light to be emitted can be stabilized and uniformized.

This dimension is dependent on a diffusion length of carriers, and if it is 3 µm or more on one side, the photonic crystals can exert influence on the whole of carriers that have seeped out.

Moreover, it is preferable that generated light in the active layer is seeped out by some sizes from both end positions of the contact region in the width direction; and wherein when viewed from a direction perpendicular to the substrate, the two-dimensional photonic crystal is located in a region equal to or wider in the width direction than a region, and this region includes the contact region and is wider than the contact region by the light-seeped-out sizes in the width direction.

In this case, the two-dimensional photonic crystal is formed so as to contain the part where light has seeped out. At a forming boundary portion of photonic crystal, scattering occurs because reflection of light occurs, and this serves as the cause for disordering the original oscillation mode of the semiconductor laser, but in this case, because the two-dimensional photonic crystal is formed so as to contain the part where light has seeped out and the two-dimensional photonic crystal is formed in a region that is wide in the width direction, there is a smaller influence due to reflection, which allows enabling a stable spatial transverse mode operation.

Advantageous Effects of Invention

The edge-emitting semiconductor laser element according to the aspect of the present invention enables a stable and uniform spatial transverse mode operation.

DESCRIPTION OF EMBODIMENTS

Hereinafter, an edge-emitting semiconductor laser element (hereinafter, referred to simply as a semiconductor laser element) according to an embodiment will be described. Also, the same reference signs will be used for the same elements, and overlapping description will be omitted.

Figure 1:
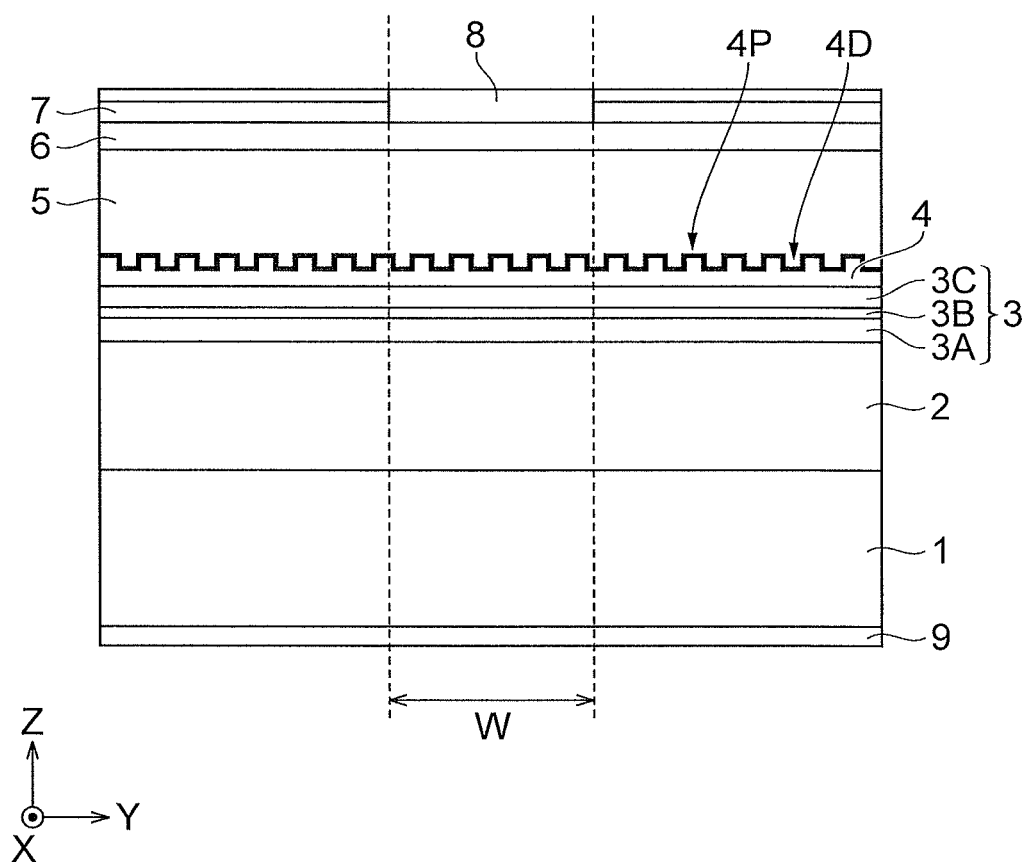
FIG. 1 is a front view of a semiconductor laser element.

FIG. 1 is a front view of the semiconductor laser element. In the same figure, an XYZ three-dimensional rectangular coordinate system is shown, and a substrate thickness direction is provided as the Z-axis, a resonator length direction is provided as the X-axis, and a width direction perpendicular to these directions is set to the Y-axis.

The semiconductor laser element includes a lower cladding layer 2, a lower light guide layer 3A, an active layer 3B, an upper light guide layer 3C, a two-dimensional photonic crystal layer 4, an upper cladding layer 5, and a cap layer (contact layer) 6 that are formed in sequence on a semiconductor substrate 1. At a back surface side of the semiconductor substrate 1, an electrode 9 is provided over the entire surface, and in a central portion in the Y-axis direction of the cap layer 6, a drive current electrode 8 is in contact. The upper electrode 8 is formed on an insulating layer 7 provided on the cap layer 6, but in the insulating layer 7, there is formed an rectangular opening extending in the X-axis direction, and through this opening, the electrode 8 is in contact with the cap layer 6.

The material/thickness of these compound semiconductor layers are as follows. Also, those without description of the conductivity types are intrinsic semiconductors having impurity concentrations of $10^{15}/cm^3$ or less. Also, the concentrations when impurities are doped are $10^{17}$ to $10^{20}/cm^3$.

Moreover, the following is an example of the present embodiment, and there is a degree of freedom in the material system, film thickness, and layer composition as long as it is a configuration containing an active layer 3B and a photonic crystal layer 4. Also, the growth temperature of AlGaAs by a MOCVD method was 500° C. to 850° C., TMA (trimethylaluminum) was used as an Al raw material for growth, TMG (trimethylgallium) and TEG (triethylgallium) were used as gallium raw materials, AsH3 (arsine) was used as an As raw material, $Si_2H_6$ (disilane) was used as a raw material for an N-type impurity, and DEZn (diethyl zinc) was used as a raw material for a P-type impurity. When GaAs is formed, supply of the Al raw material (TMA) is stopped in the formation process of AlGaAs.

Cap layer 6:
P-type GaAs/50~500 nm
Upper cladding layer 5:
P-type AlGaAs/1.0~3.0 μm
Photonic crystal layer 4:
i-type GaAs/50~500 nm
Upper light guide layer 3C:
i-type AlGaAs/10~500 nm
Active layer 3B (multi-quantum-well structure)
i-type AlGaAs/InGaAs MQW/10~100 nm
Lower light guide layer 3A:
i-type AlGaAs/10~5000 nm
Lower cladding layer 2:
N-type AlGaAs/1.0~3.0 μm
Semiconductor substrate 1:
N-type GaAs/80~350 μm Also, the electrode 8 is in contact with a semiconductor layer formed of the foregoing layers 2 to 6, and the contact region extends along the X-axis. When a current is caused to flow between the upper and lower electrodes 8, 9, a current flows in a region directly under the contact region (a region with a width W) in the electrode 8, a light emitting layer 3 in this region emits light, and laser light is output toward a direction perpendicular to an edge of the substrate. Also, the light emitting layer 3 means here a layer containing the active layer 3B and the upper and lower guide layers 3A, 3C.

Also, the photonic crystal layer 4 includes a basic layer that is originally present and a layer formed by opening holes to serve as lattice points in a basic layer, and the position where the holes are formed will be referred to as dent portions 4D, and the position where the holes are not formed will be referred to as projection portions 4P. Also, FIG. 1 shows a configuration of the photonic crystal layer 4 where holes are formed as lattice points in a basic layer, and then a P-type cladding layer 5 is formed thereon entirely, but the dent portions 4D may be buried with a material different from that of a P-type cladding layer, or the dent portions 4D may not be buried and an upper layer may be formed with the vacant holes remaining.

Also, the relationships of the dent and projection portions can also be reversed. That is, the photonic crystal layer 4 includes a basic layer that is originally present and a burying layer for which etching is applied to a basic layer so that columns to serve as lattice points remain and the peripheries are buried, and in this case, the position where the columns are formed will be referred to as projection portions 4P, and the position where the columns are not formed will be referred to dent portions 4D.

Figure 2:
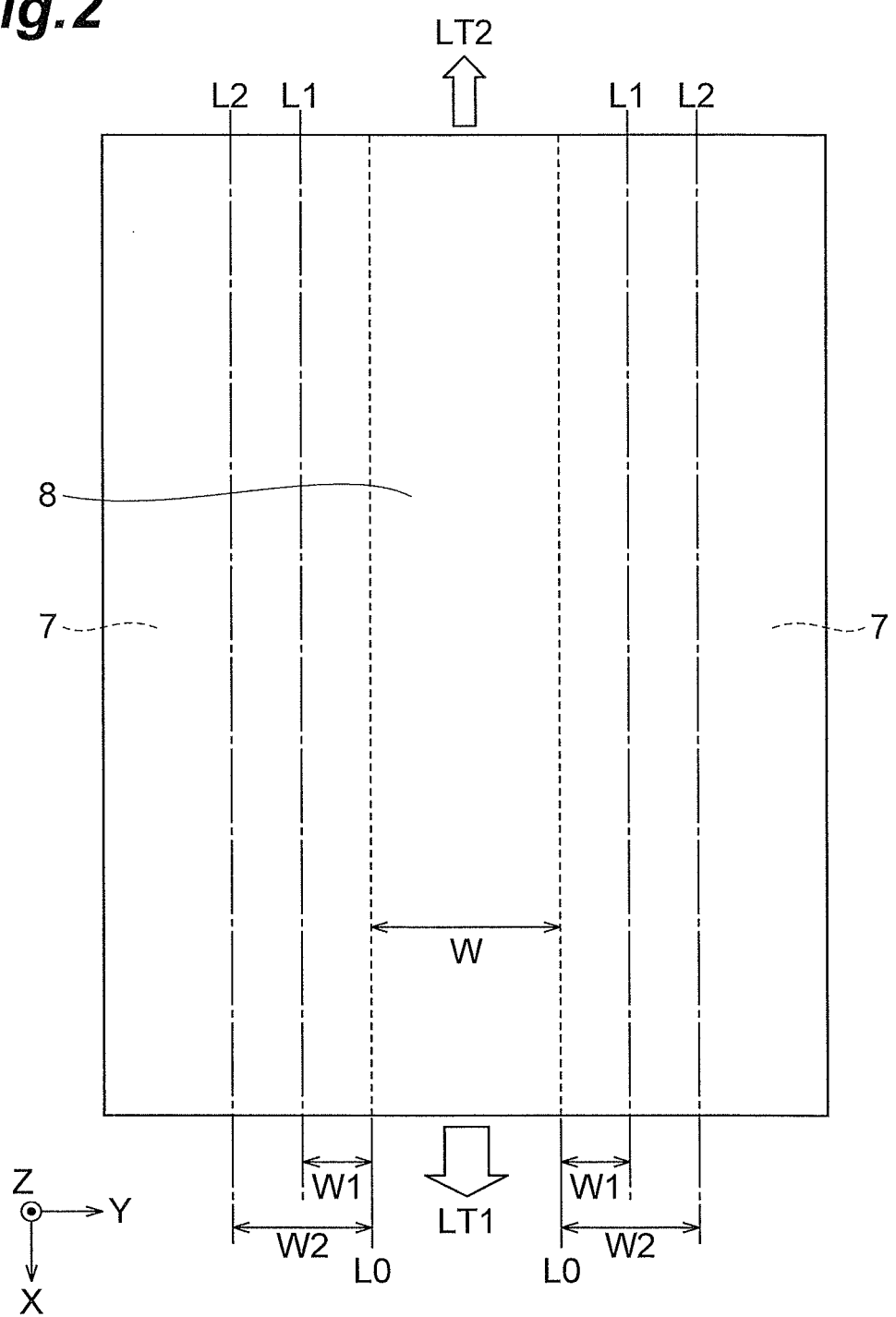
FIG. 2 is a plan view of the semiconductor laser element.

FIG. 2 is a plan view of the semiconductor laser element.

A laser light LT1 is emitted from a front element edge located at one end of a resonator. Of course, a laser light LT2 is also emitted from a rear element edge located at the other end in the opposite direction. In some cases, at this rear edge, a high-reflection film is provided, and the output intensity is made smaller than that of an output toward the front.

Here, a current flows to a region directly under the contact region of the electrode 8 defined by the width W, while carriers slightly spread out also transversally. The region in which carriers flow, spreading out in the width direction from the contact region with a width W has been defined by a width W1, and is a region between a segment L1 and a segment L0. The width W1 is defined by a diffusion length of carriers, and is generally 3 μm in the case of a compound semiconductor. If this dimension W1 is 3 μm or more on one side, the photonic crystal can exert influence on the whole of carriers that have seeped out.

Further, a light generated in the active layer 3B spreads transversally through the light emitting layer 3 along the guide layers 3A, 3C. The region in which a light spreads, seeping out in the width direction from the contact region with a width W has been defined by a width W2, and is a region between a segment L2 and the segment L0. This width W2 is on the order of 50 μm.

It is preferable that, when viewed from the Z-axis direction, the photonic crystal is formed up to a region that is further outside than the segment L1 to define the width W1, preferably, further outside than the segment L2 to define the width W2.

That is, the two-dimensional photonic crystal is, when viewed from a direction perpendicular to the substrate 1 (Z-axis), located in a region containing the contact region with a width W and wider in the width direction than the contact region, and have a refractive index periodic structure in which the refractive index periodically changes at every interval d1 along the X-axis direction. The interval d1 is, in a photonic crystal layer, given by a distance between centroids (an X-axis direction distance) of lattice points that are different in refractive index from the periphery.

The refractive index periodic structure satisfies a Bragg's diffraction condition: $d1=q1 \times \lambda/(2 \times n)$ with respect to a laser light with a wavelength of $\lambda$, where q1 is a natural number and n is an effective refractive index of light in an active layer. For example, the wavelength $\lambda$=980 nm, q1=2, n=3.35, and d1=292.5 nm.

In this case of a semiconductor laser element, there are formed two-dimensional photonic crystal up to the region where carriers spread out outside the electrode contact region, and the Bragg diffraction condition is satisfied in the resonator length direction, so that the light mode is stabilized, and the light emission shape can be uniformized.

Moreover, the two-dimensional photonic crystal has a refractive index periodic structure in which the refractive index periodically changes at every interval d2 along a direction that intersects the X-axis (e.g. the Y-direction or a direction that forms 60° with X-axis), and satisfy a Bragg's diffraction condition: $d2=q2 \times \lambda/(2 \times n)$ with respect to a laser light with a wavelength of $\lambda$, where q2 is a natural number.

In this case of a semiconductor laser element, there is formed two-dimensional photonic crystal up to the region where carriers spread out outside the electrode contact region, and the Bragg diffraction condition is satisfied also in the direction that intersects the resonator length, so that the light mode is stabilized, and the light emission shape can be uniformized.

That is, the two-dimensional photonic crystal is, when viewed from a direction perpendicular to the substrate, located in a region containing the contact region defined by the width W and wider in the width direction than the contact region by no less than the dimension W1 by which carriers supplied into the active layer 3B have spread out, to the outside in the width direction, respectively from both end positions in the width direction.

Because the two-dimensional photonic crystal is are formed so as to contain the part where carriers have spread out, as a result of an optical electromagnetic field distribution in the element being defined, the light mode is stabilized, and the light emission shape can be uniformized.

Moreover, the two-dimensional photonic crystal is are, when viewed from a direction perpendicular to the substrate, located in a region containing the contact region defined by the width W and wider in the width direction than the contact region by no less than the dimension W2 by which a light generated in the active layer 3B has seeped out, to the outside in the width direction, respectively from both end positions in the width direction.

In this case, because the two-dimensional photonic crystal is formed so as to contain the part where light has seeped out, influence on the oscillation mode caused by reflection at a forming boundary portion of photonic crystals can be disregarded, which allows enabling a stable spatial transverse mode operation.

Figure 3:
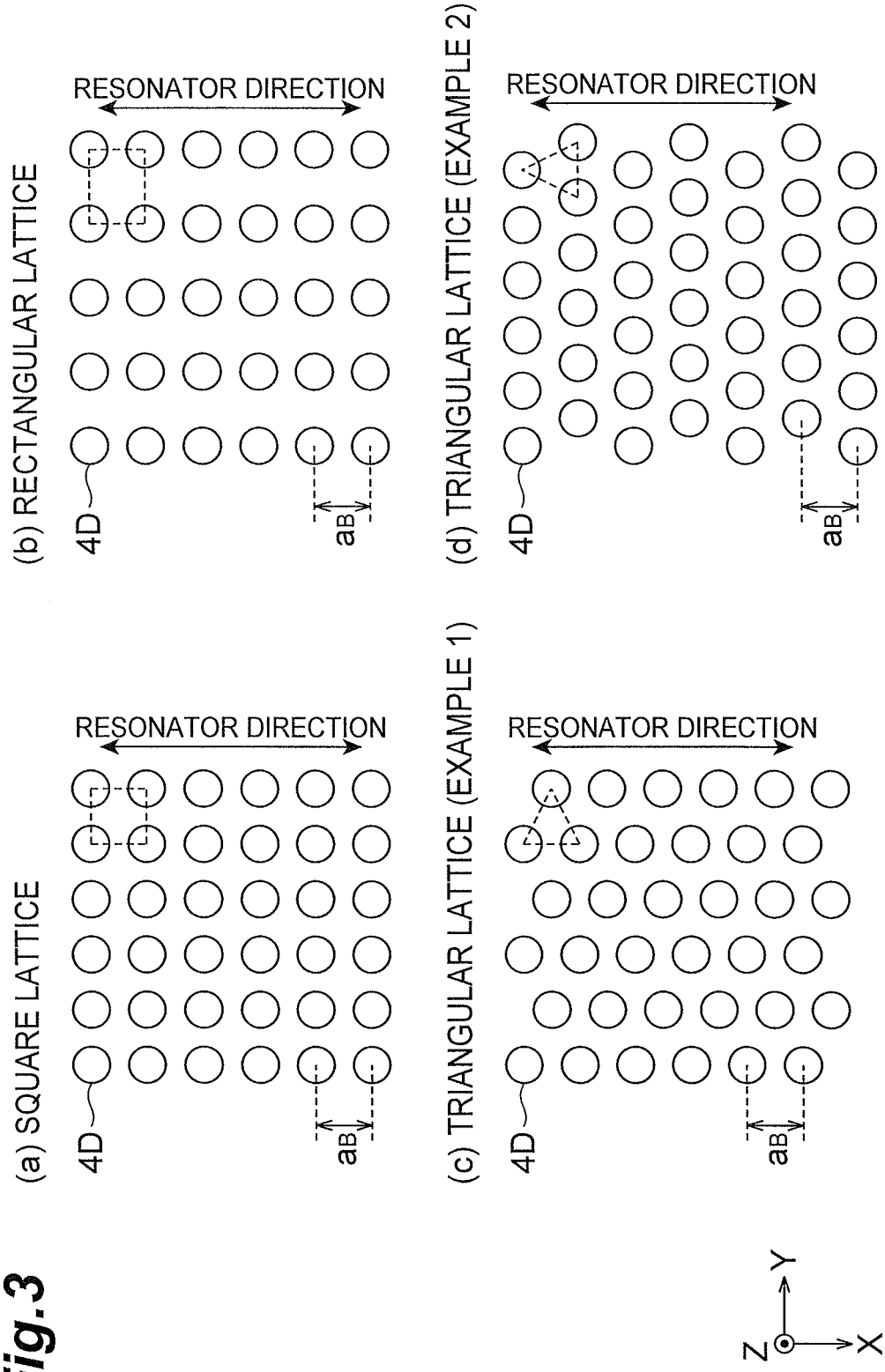
FIG. 3 includes views showing arrangements of lattice points in photonic crystal.

FIG. 3 includes views showing arrangements of lattice points in photonic crystal. Here, examples are shown in which circular dent portions 4D formed by etching are arrayed, but in the case of a structure where columnar projection portions 4P are formed by etching, the position of the dent portions 4D is replaced with the projection portions 4P.

In FIG. 3(a), there are located dent portions 4D at lattice point positions of a square lattice, and in the X-axis direction (resonator direction), the dent portions 4D are disposed at every interval $a_B$. The interval $a_B$ is equal to the above-described distance d1. The dent portions 4D are also disposed at equal intervals along the Y-axis direction, and this interval is equal to the above-described distance d1.

In FIG. 3(b), there are located dent portions 4D at lattice point positions of a rectangular lattice, and in the X-axis direction (resonator direction), the dent portions 4D are disposed at every interval $a_B$. The interval $a_B$ is equal to the above-described distance d1. The dent portions 4D are also disposed at equal intervals along the Y-axis direction, and here, the interval d2 in the Y-axis direction is set wider than the distance d1 in the X-axis direction, but the interval d2 may be set narrower. Moreover, the interval d2 in the Y-axis direction may satisfy the above-described Bragg condition.

In FIG. 3(c), there are located dent portions 4D at lattice point positions of a triangular lattice, and in the X-axis direction (resonator direction), the dent portions 4D are disposed at every interval $a_B$. The interval $a_B$ is equal to the above-described distance d1. The dent portions 4D are also disposed at equal intervals along a direction that forms 60 degrees with the X-axis, and this interval is equal to the above-described distance d1. Here, the interval in the intersecting direction is set equal to the interval d1 in the X-axis direction.

Also in FIG. 3(d), there are located dent portions 4D at lattice point positions of a triangular lattice, and in the X-axis direction (resonator direction), the dent portions 4D are disposed at every interval $a_B$. The interval $a_B$ is equal to the above-described distance d1. The dent portions 4D are also disposed at equal intervals along the Y-axis direction, and here, the interval d2 in the Y-axis direction is set wider than the interval d1 in the X-axis direction. The respective lattice point shapes of photonic crystals are shown as circles in FIG. 3, but other shapes such as triangles, trapezoids, or ellipses or lattice point shapes consisting of multiple points may be used without limitation thereto.

Figure 4:
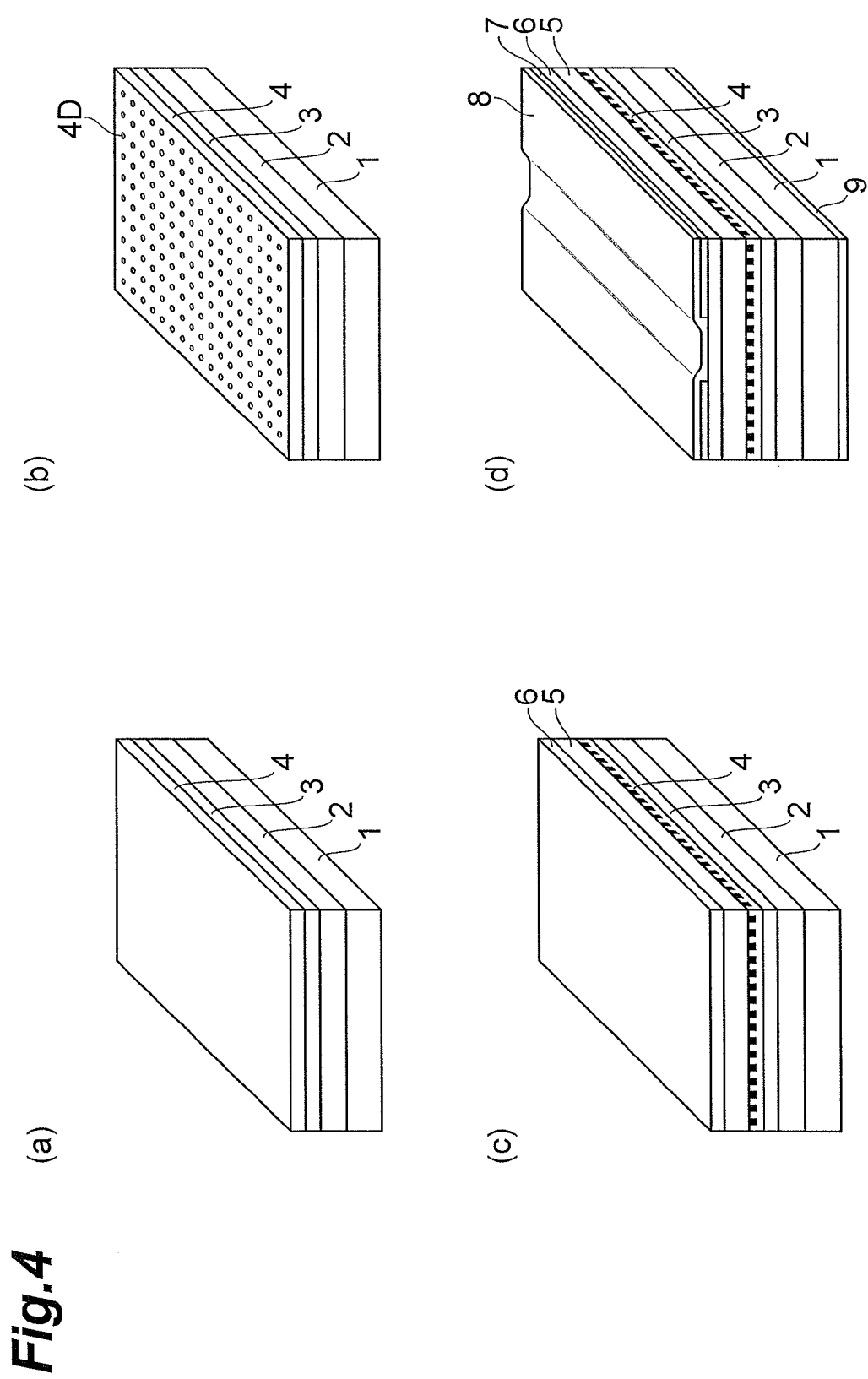
FIG. 4 includes views for explaining a method of manufacturing the semiconductor laser element.

FIG. 4 includes views for explaining a method of manufacturing the semiconductor laser element.

First, on a substrate 1, a lower cladding layer 2, a light emitting layer 3, and a photonic crystal layer 4 are stacked in sequence by using a MOCVD method (FIG. 4(a)). Next, after coating a resist on the photonic crystal layer 4, the photoresist is patterned by exposure, and this is then used as a mask for etching the photonic crystal layer 4 to open a plurality of holes 4D by etching (FIG. 4(b)). For the exposure of a resist, an ordinary ultraviolet exposure device can be used, but electron beam drawing exposure, a nanoimprint method, or an interference exposure method may be used. In the present fabrication example, two-dimensional photonic crystals are formed on the entire element.

Then, an upper cladding layer 5 and a cap layer 6 are stacked thereon in sequence by using a MOCVD method (FIG. 4(c)). Lastly, an insulating layer 7 made of SiN is formed on the cap layer 6 by a plasma CVD method. For the insulating layer 7, by coating a resist and patterning this by exposure and development, a resist pattern formed with an opening along the X-axis direction is obtained. Then, this resist is used as a mask for patterning the insulating layer 7 by reactive ion etching to form an opening along the X-axis direction. Thereafter, an electrode 8 is formed by vapor deposition on the insulating layer 7 (FIG. 4(d)). As this electrode material, Ti/Pt/Au can be used. After polishing the substrate 1 until reaching a thickness of 150 µm or less and removing strain and stains on the front surface by applying a chemical treatment, an electrode 9 is vapor-deposited on the back surface of the substrate 1. As this electrode material, AuGe/Au can be used. The element substrate fabricated as above is cleaved so as to be a desired element size and made into chips. Lastly, by forming a low-refraction film at a front-side edge and forming a high-reflection film at a rear-side edge according to necessity, the semiconductor laser element shown in FIG. 1 is completed.

The above-described semiconductor laser element (FIG. 3(a): diameter R of the dent portions 4D of lattice points=135 nm, lattice interval $a_B$ in the X-axis direction=292 nm, lattice interval in the Y-axis direction=$a_B$) was experimentally fabricated. Also, the photonic crystal is formed on the entire substrate when viewed from the Z-axis direction, the resonator wavelength was set to 2000 µm, and the width W was set to 100 µm. This semiconductor laser element was used as an example, and similarly, a Fabry-Perot type semiconductor laser not including a photonic crystal layer was also fabricated, and this was used as a comparative example.

Figure 5:
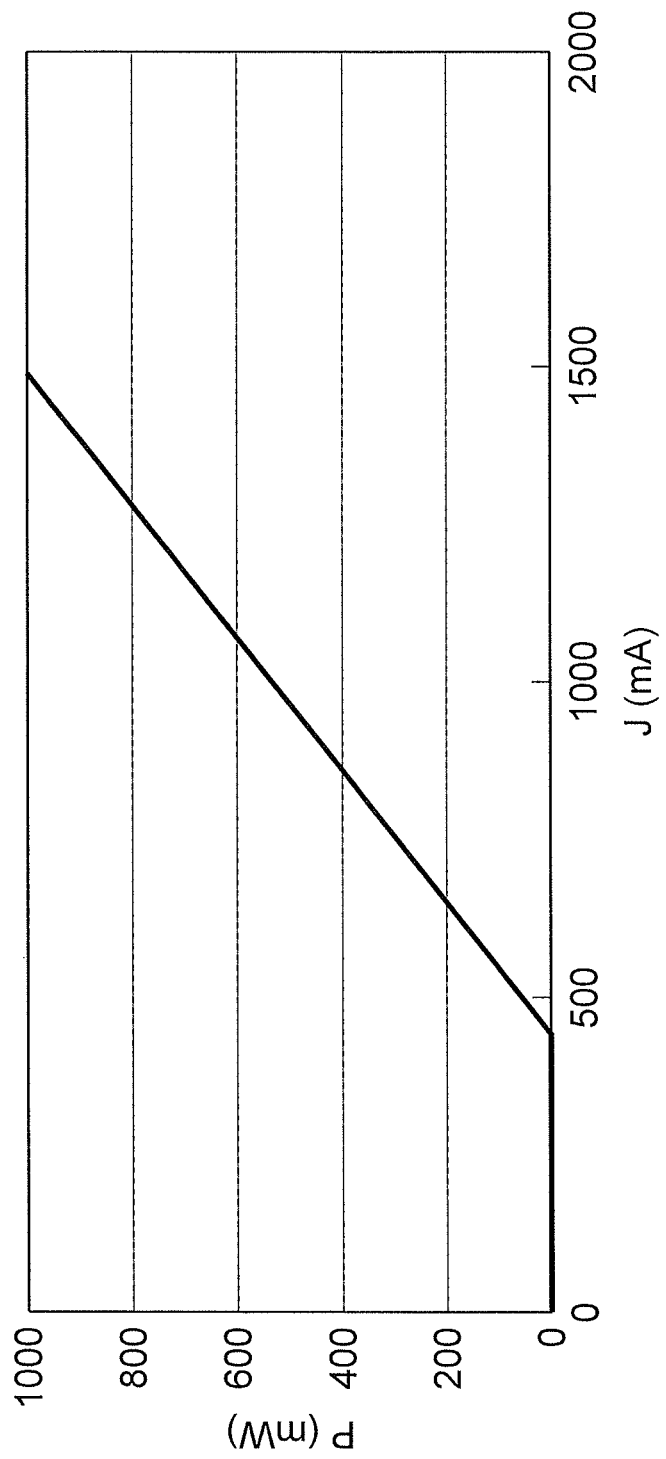
FIG. 5 is a graph showing a relationship between the supply current J(mA) and the light output P (mW).

FIG. 5 is a graph showing a relationship between the supply current J(mA) and the output P (mW) during continuous wave (CW) driving of the semiconductor laser element according to the example. The output linearly increases with an increase in current.

Figure 6:
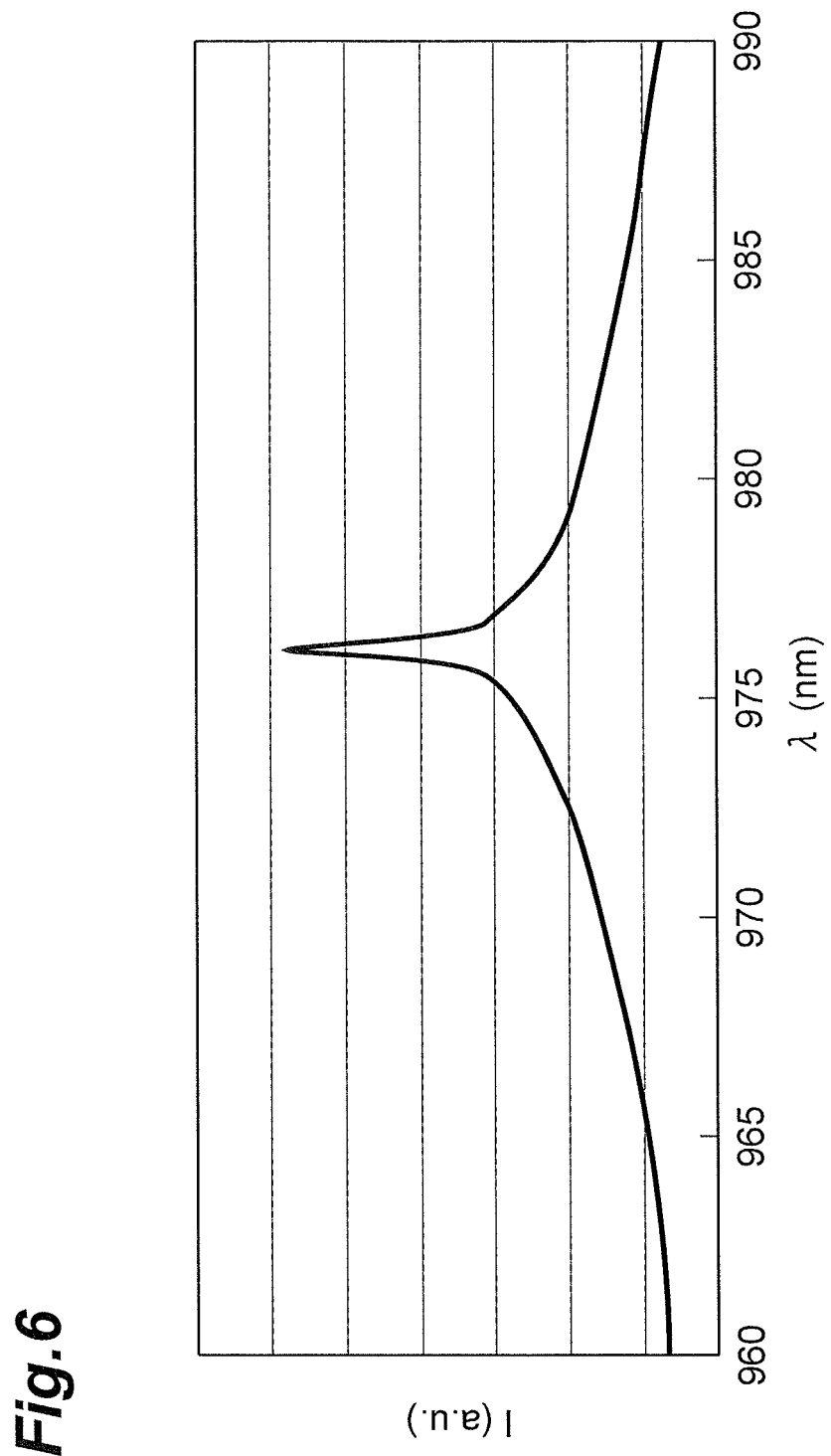
FIG. 6 is a graph showing a relationship between the wavelength λ (nm) of light and the intensity I (a.u.) of logarithmic representation.

FIG. 6 is a graph showing a relationship between the wavelength λ (nm) of light and the intensity I (a.u.) according to the example. The intensity I is represented by logarithms. A single peak was obtained at a wavelength of 980 nm. It can be understood that, in a conventional Fabry-Perot type semiconductor laser without photonic crystal, because a multispectral oscillation with multiple peaks occurs, the effect of photonic crystal works, which thus results in a single peak.

Figure 7:
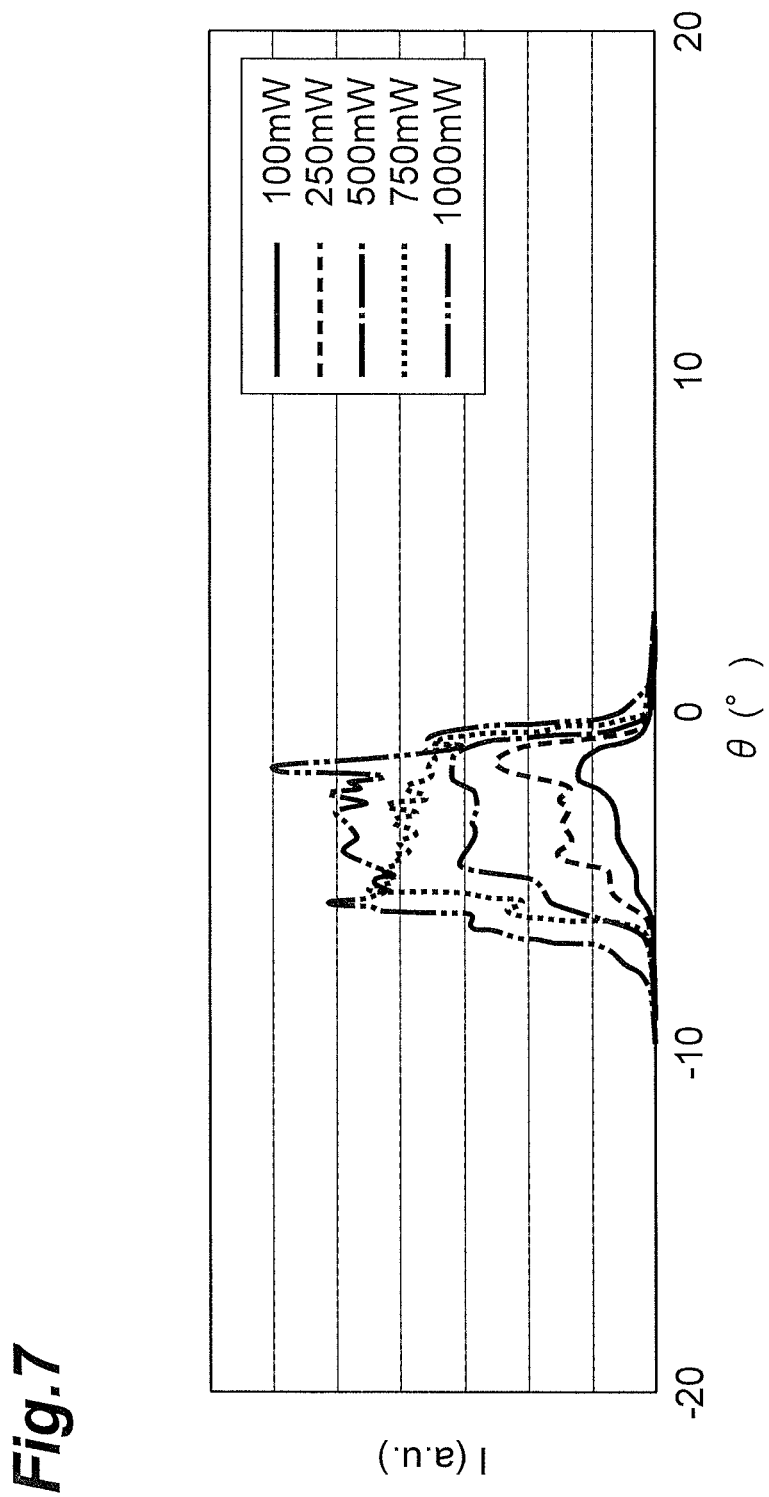
FIG. 7 is a graph showing a relationship of the light output dependence between the emission angle θ (°) and the intensity I (a.u.) of far-field patterns of a semiconductor laser element according to a comparative example.
Figure 8:
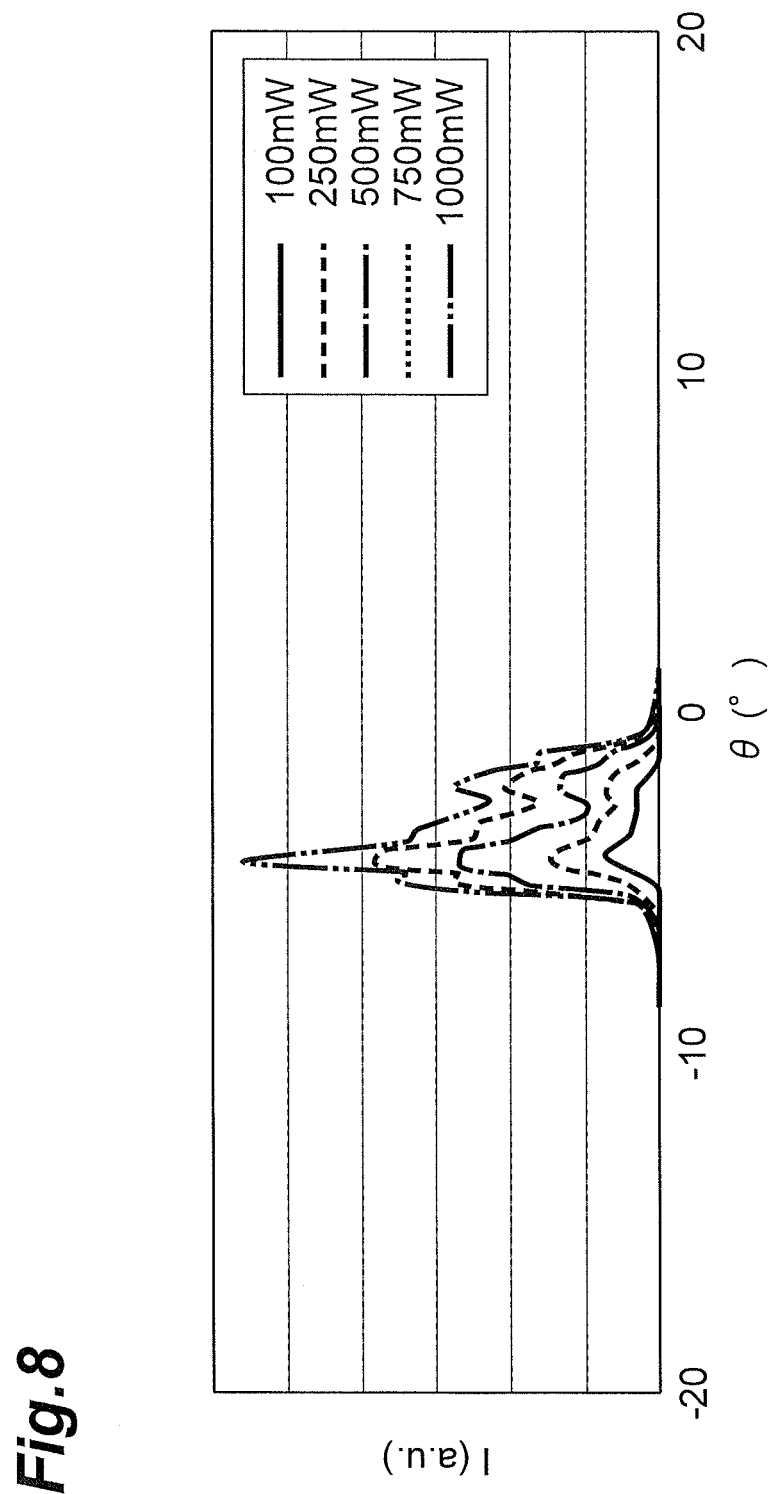
FIG. 8 is a graph showing a relationship of the light output dependence between the emission angle θ (°) and the intensity I (a.u.) of far-field patterns of a semiconductor laser element according to an example.

FIG. 7 is a graph showing a relationship between the emission angle θ (°) and the intensity I (a.u.) of far-field patterns in a direction along the light emitting layer 3 of the laser element according to the comparative example. FIG. 8 is a graph showing a relationship between the emission angle θ (°) and the I intensity (a.u.) of far-field patterns in a direction along the light emitting layer 3 of the laser element according to the example. The light output of the elements was changed from 100 mW to 1000 mW. The angle θ represents an angle of divergence in a reference axis (Y-axis) direction of a laser radiation.

It can be understood that, in the example, the emission angles (radiation angles) θ (°) are narrower in far-field patterns than those of the comparative example. In the example, not only is the number of peaks small but the output dependence of peak shapes is also small, and handling of laser light by an optical system lens is considered to become easier.

Figure 9:
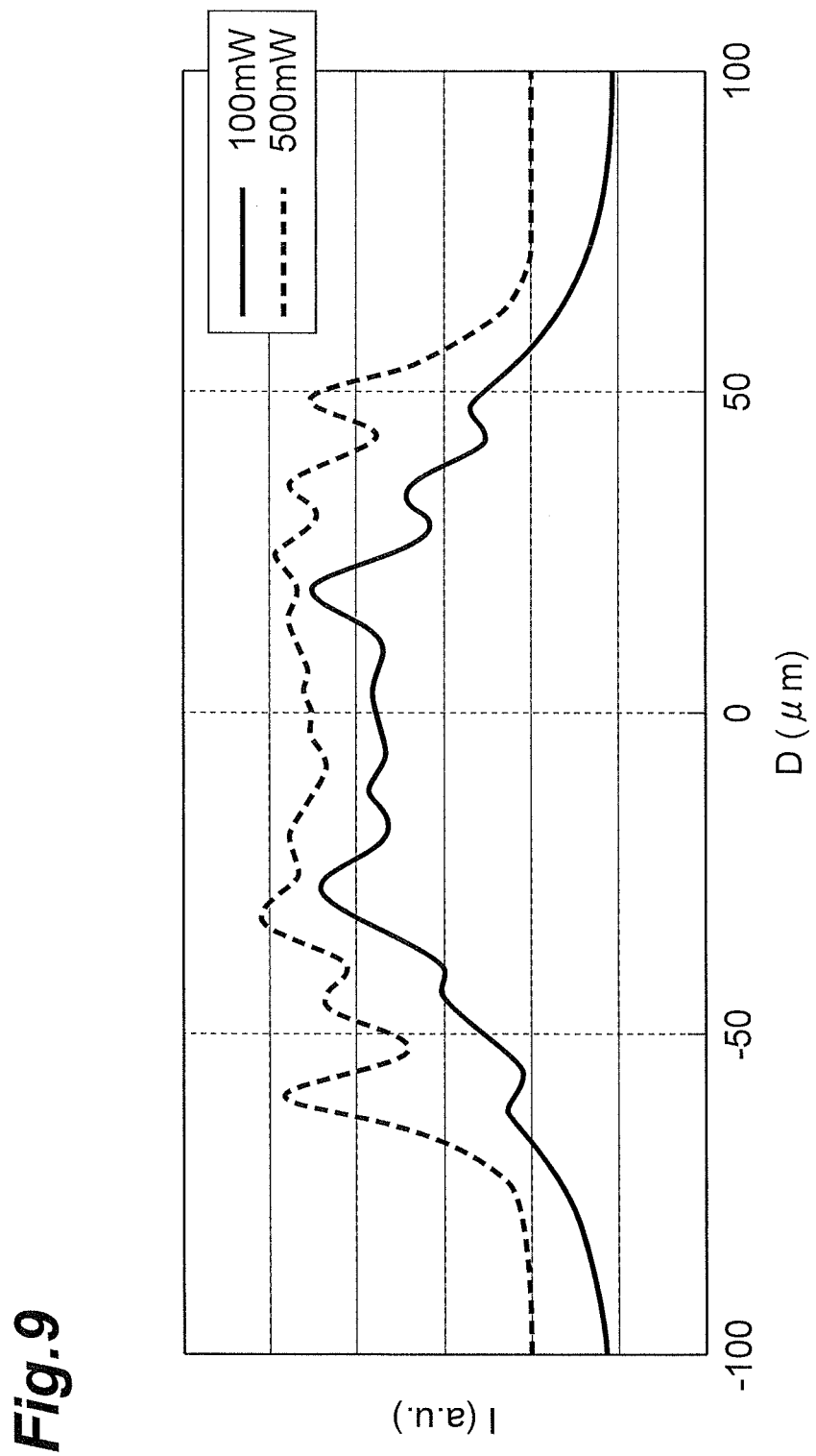
FIG. 9 is a graph showing a relationship between the distance D (μm) and the intensity I (a.u.) of near-field patterns of the semiconductor laser element according to the comparative example.
Figure 10:
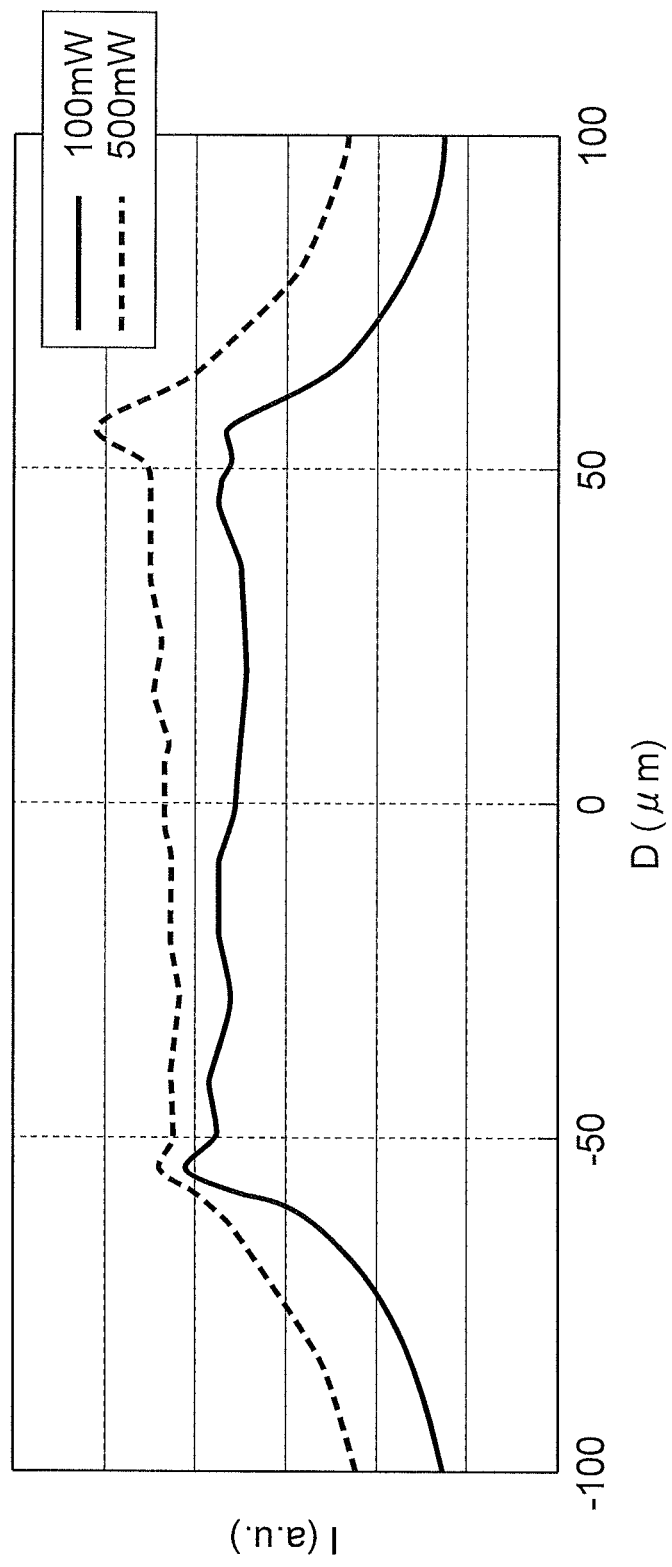
FIG. 10 is a graph showing a relationship between the distance D (μm) and the intensity I (a.u.) of near-field patterns of the semiconductor laser element according to the example.

FIG. 9 is a graph showing a relationship between the distance D (µm) and the intensity I (a.u.) in a direction along the light emitting layer 3 of near-field patterns of the laser element according to the comparative example. FIG. 10 is a graph showing a relationship between the distance D (µm) and the intensity I (a.u.) of near-field patterns of the laser element according to the example. The light output of the elements was provided as 100 mW and 500 mW to perform measurements. The distance D represents a distance along the reference axis (Y-axis) of the light emitting layer 3. In the comparative example, with an increase in output, the number of peaks increases, and the light emission peak positions also change. That is, the spatial transverse mode is not stable. On the other hand, it can be understood that, in the embodiment, the intensity of near-field patterns is uniform, and variation in light emission is small, and the spatial transverse mode is restricted from changing and is thus stable. In such a case, light condensing by a lens can be precisely performed, and a positionally uniform light intensity distribution can be obtained, and therefore, the range of application is wide, which is considered to be excellent for a device.

As above, in the semiconductor laser element of the example, an oscillation operation occurs with a single-peak and narrow spectral width, the radiation pattern is narrow, the number of peaks is also small, and the light output dependence is also small. Moreover, it can be understood that, also in near-field patterns, there is a uniform light distribution, and a stable spatial transverse multimode has occurred. Also, the foregoing effects are considered to have been obtained because of the periodic structure of the refractive index in the resonator length direction of photonic crystal and the presence of a region spreading in the thickness direction of the resonator of photonic crystal, and if these conditions have been satisfied, the same effects are obtained even when the shape of dent portions and their arrangement and the like are of other structures. Moreover, when manufacturing variation is taken into consideration, in order to uniformize characteristics of each product, it is preferable that a spread in the width direction relative to the resonator length of photonic crystal is sufficiently wider than a light emitting region, and accordingly, it is preferable that photonic crystal are formed so as to cover the entire surface of a region formed with an active layer.

REFERENCE SIGNS LIST

4 . . . two-dimensional photonic crystal, 8 . . . electrode, 1 . . . semiconductor substrate, 2 . . . lower cladding layer, 3B . . . active layer, 5 . . . upper cladding layer, 6 . . . cap layer.

The invention claimed is:

1. An edge-emitting semiconductor laser element comprising:
   a semiconductor layer including a substrate, an active layer, a light guide layer, and a cladding layer, wherein the active layer, the light guide layer, and the cladding layer are stacked in sequence on the substrate; and
   a drive current electrode including a contact region being in contact with the semiconductor layer, the contact region extending along one direction perpendicular to a thickness direction of the substrate,
   wherein the edge-emitting semiconductor laser element emits laser light from an edge located at one end in the one direction in the active layer,
   wherein said edge-emitting semiconductor laser element further includes two-dimensional photonic crystals formed in the semiconductor layer,
   wherein the one direction of the contact region defined as a length direction and a direction perpendicular to both of the length direction and the substrate thickness direction is defined as a width direction,
   wherein when viewed in the thickness direction of the substrate, the two-dimensional photonic crystals are located in a region containing the contact region and are wider in the width direction than the contact region,
   wherein the two-dimensional photonic crystals have a refractive index periodic structure arranged in a square lattice in which the refractive index periodically changes at every interval d1 along the one direction and satisfy a Bragg's diffraction condition:

$$d1 = q1 \times \lambda/(2 \times n)$$

with respect to the laser light with a wavelength of $\lambda$, where q1 is a natural number and n is an effective refractive index of light in the active layer,
   wherein generated light in the active layer is seeped out by some sizes from both end positions of the contact region in the width direction; and
   wherein when viewed from a direction perpendicular to the substrate, the two-dimensional photonic crystals are located in a region equal to or wider in the width direction than a region, and this region includes the contact region and is wider than the contact region by the light-seeped-out sizes in the width direction.

2. The edge-emitting semiconductor laser element according to claim 1, wherein
   the two-dimensional photonic crystals have a refractive index periodic structure arranged in the square lattice in which the refractive index periodically changes at every interval d2 along a direction that intersects the one direction, and
   satisfies a Bragg's diffraction condition:

$$d2 = q2 \times \lambda/(2 \times n)$$

with respect to the laser light with a wavelength of $\lambda$, where q2 is a natural number.

3. The edge-emitting semiconductor laser element according to claim 1,
   wherein supplied carries are spread out by some sizes from both end positions of the contact region in the width direction; and
   wherein when viewed from a direction perpendicular to the substrate, the two-dimensional photonic crystals are located in a region equal to or wider in the width direction than a region, and this region includes the contact region and is wider than the contact region by the carrier-spread-out sizes in the width direction.

4. The edge-emitting semiconductor laser element according to claim 3, wherein the dimension is 3 µm.

* * * * *